United States Patent [19]

Crowe et al.

[11] Patent Number: 4,729,740

[45] Date of Patent: Mar. 8, 1988

[54] FLUORESCENT BALLAST HAVING INTEGRAL CONNECTOR

[75] Inventors: Don H. Crowe, Clemmons; Jessie L. Moser, High Point, both of N.C.

[73] Assignee: AMP Incorporated, Harrisburg, Pa.

[21] Appl. No.: 941,020

[22] Filed: Dec. 12, 1986

[51] Int. Cl.[4] .......................... H01R 9/09; H05K 5/00

[52] U.S. Cl. .......................................... 439/76; 174/59; 439/438

[58] Field of Search .................. 339/17 C, 17 LC, 51, 339/95 D; 174/59, 52 R, 52 PE; 361/394, 395, 396, 399, 400; 336/90, 92, 96, 107, 192; 362/217, 218, 221; 439/76, 437-441

[56] References Cited

U.S. PATENT DOCUMENTS 2,777,893 1/1957 De Russo ............................ 361/399
3,135,822 6/1964 Baran et al. ...................... 339/95 D
3,383,565 5/1968 Gritton ........................... 174/52 PE
4,047,242 9/1977 Jakob et al. .................... 339/17 LC
4,129,897 12/1978 Telewski et al. .................. 361/399
4,519,015 5/1985 Lin ...................................... 336/92

FOREIGN PATENT DOCUMENTS 2018051 10/1979 United Kingdom ............. 339/95 D

*Primary Examiner*—Neil Abrams
*Attorney, Agent, or Firm*—Eric J. Groen

[57] ABSTRACT

An electrical ballast for use with fluorescent light fixtures includes a housing with side and endwalls. The endwalls have cutout portions therein for receiving an electrical connector. The electrical components which comprise the ballast are mounted on a printed circuit board, and the connector is electrically interconnected to the printed circuit board and inserted within the cutout portion of the ballast housing. The connector is profiled for receipt within the cutout portion to seal the cavity within the housing during the curing period of the potting compound.

18 Claims, 5 Drawing Figures

FLUORESCENT BALLAST HAVING INTEGRAL CONNECTOR

BACKGROUND OF THE INVENTION

1. Field of the Invention

The instant invention relates to electrical ballasts for fluorescent lighting and the like, and connectors therefor.

2. Description of the Prior Art

Fluorescent electrical ballasts are used in areas where fluorescent lighting is present, and are typically located within or behind the fluorescent light fixture. Typically, the electrical ballast comprises a long rectangular metal box or "can" with the electrical components mounted inside. A sealer or "potting compound" is then poured into the can which hardens to seal the electrical components within the can. Also typical is to have several discrete wires projecting through the potting material for electrical interconnection thereto. Typically the fluorescent fixture includes complementary discrete wires for interconnection to the discrete wires of the ballast.

A common installation procedure includes stripping a portion of the insulation off of the fixture and ballast wires to expose a portion of the conductor. The ends of the respective ballast and fixture wires are then twisted together, and a plastic threaded nut is then threaded over the twisted conductors. This method of installing or replacing a ballast is very labor intensive, and also it is typically a difficult procedure, in that one must manipulate oneself while being elevated to the height of the fluorescent light fixture. This method of installing or replacing a ballast also presents a hazardous condition for the installer. A typical ballast has a plurality of discrete wires extending from the can, some of which are typically activated, or "live". These live wires, then, present a hazard to the installer as he or she may contact the wires or the wires may come into contact with conductive objects located proximate to them. The hazard of the exposed electrical live wires could, then, result in the electrical shocking or electrocution of the installer.

The industry which manufactures electrical ballasts has recently begun mounting the components on printed circuit boards to eliminate the discrete wiring within the ballasts. The interior of the ballast is again potted to seal the components within the ballast housing. However, discrete wires still project through the potting for interconnection to the respective discrete wires of the wiring from the lighting fixtures. One such manufacturer has included an electrical connector at the end of the discrete wires for interconnection thereto by a mating electrical connector. The disadvantage to having an electrical connector at the end of the discrete wires is that typically the fluorescent fixtures are not sold with a mating electrical connector. Therefore, the manufacturer of the ballast has to include both connector halves which increases the cost of the electrical ballast. Furthermore, the installer of the ballast must not only replace the ballast but must also terminate the discrete wires of the lighting to the mating half of the electrical connector. When replacing the ballast, the user of the electrical light fixture must buy a ballast which also carries an electrical connector which is matable with the electrical connector of the first ballast installed. Otherwise, the electrical connector on the lighting fixture must also be replaced when the ballast is replaced.

SUMMARY OF THE INVENTION

It is an object of the instant invention to design an electrical ballast and an electrical connector therefor which provides an economical electrical interconnection method for electrical ballasts and fixtures.

It is a further object of the instant invention to design an electrical ballast and an electrical connector therefor which is easily replaceable and requires minimal labor.

It is an object of the instant invention to eliminate the discrete wires projecting from the electrical ballast, thereby eliminating one electrical interface.

It is an object of the instant invention to design an electrical ballast connector which does not require a mating half for interconnecton to the electrical lighting fixture.

It is an object of the instant invention to design a ballast which includes the electrical connector integrally mounted therein, yet maintains accessibility to the electrical terminals from the exterior of the ballast housing.

It is an object of the instant invention to design a ballast connector which will eliminate the handling of external wires during the manufacturing of the ballast.

It is an objective of the instant invention to design a ballast connector which will make the testing of the ballast, during the manufacturing process less time consuming.

It is an objective of the instant invention to design a ballast connector which will allow the ballast to be robotically assembled.

The above objectives were accomplished by designing the electrical ballast having a housing portion defined by sidewalls and endwalls, the endwalls having cutout portions which receive the electrical connectors. The electrical connectors include electrical terminals which are directly interconnected to the printed circuit board thereby eliminating the discrete wires extending from the ballast. The electrical connectors also include means for electrically connecting exposed conductors of fixture wires directly to the electrical terminals, thereby eliminating a mating electrical connector. The connector fills the cutout portion of the sidewall in such a manner so as to seal the ballast cavity to retain the potting material until such time as the potting material cures.

DETAILED DESCRIPTION OF THE PREFERRED EMBODIMENT

Figure 1:
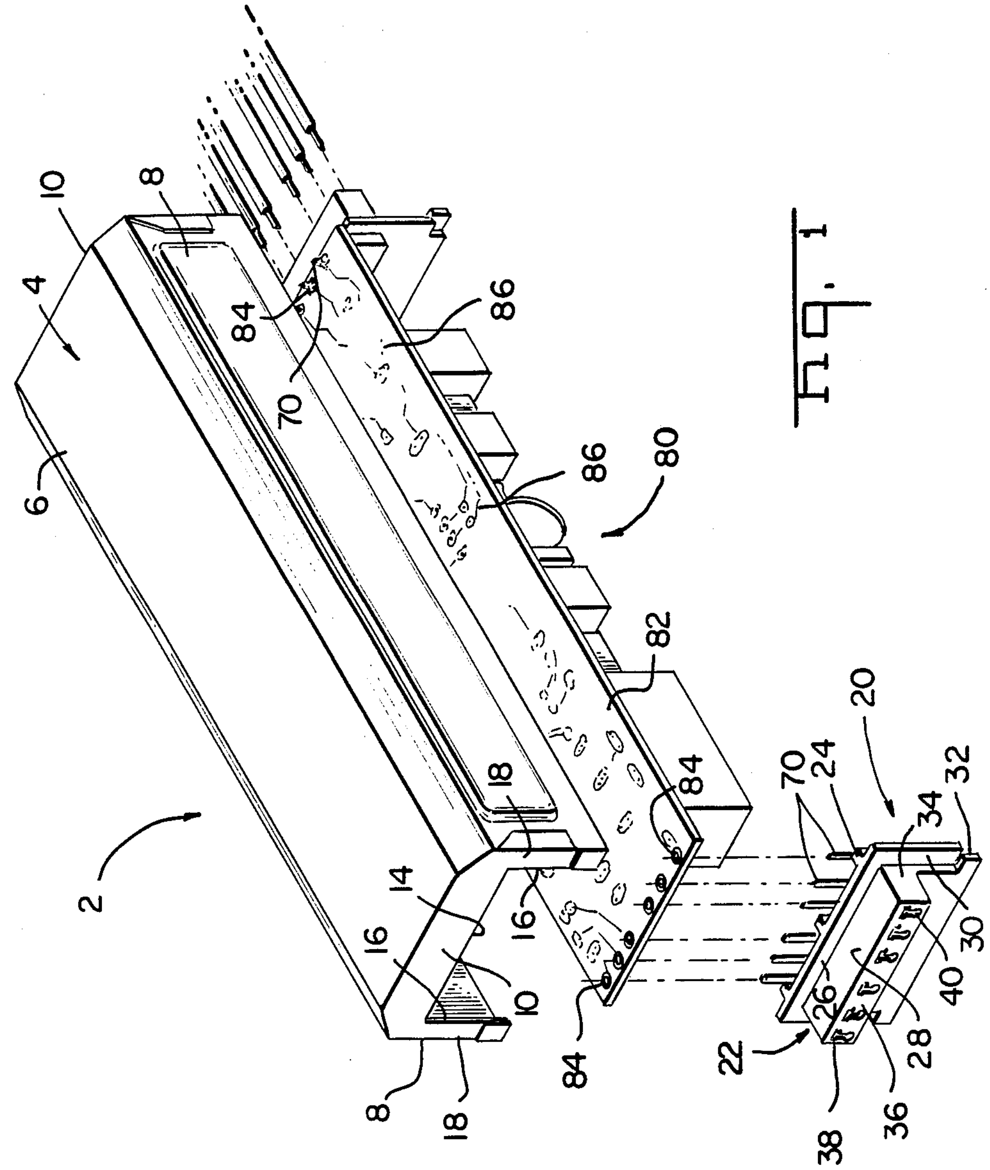
FIG. 1 is an isometric view of the ballast with the components exploded therefrom.

Referring to FIG. 1, the electrical ballast connector 2 includes a ballast can 4 having sidewalls 8 and endwalls 10. An interior cavity is formed by the endwalls and sidewalls, the cavity being shown generally as 12. Each of the endwalls 10 has a cutout portion which is defined by an upper edge 14 and two side edges 16. Two sidewalls 18 are formed by the side edges 16 in the cutout portion.

The electrical connector 20 of the instant invention includes an insulative housing 22 having a plurality of terminals 70 therein. The electrical connector 20 further includes a mounting surface 24 and an outside surface 26 and 30. The connector further comprises a ledge portion 38 extending from the surfaces 26, 30 having a top surface 28, side surfaces 34 and a front mating face 36. Two tabs 32 extend from the insulative body 22 in a spaced apart parallel relationship with surface 30 to define a gap between the two surfaces.

Figure 2:
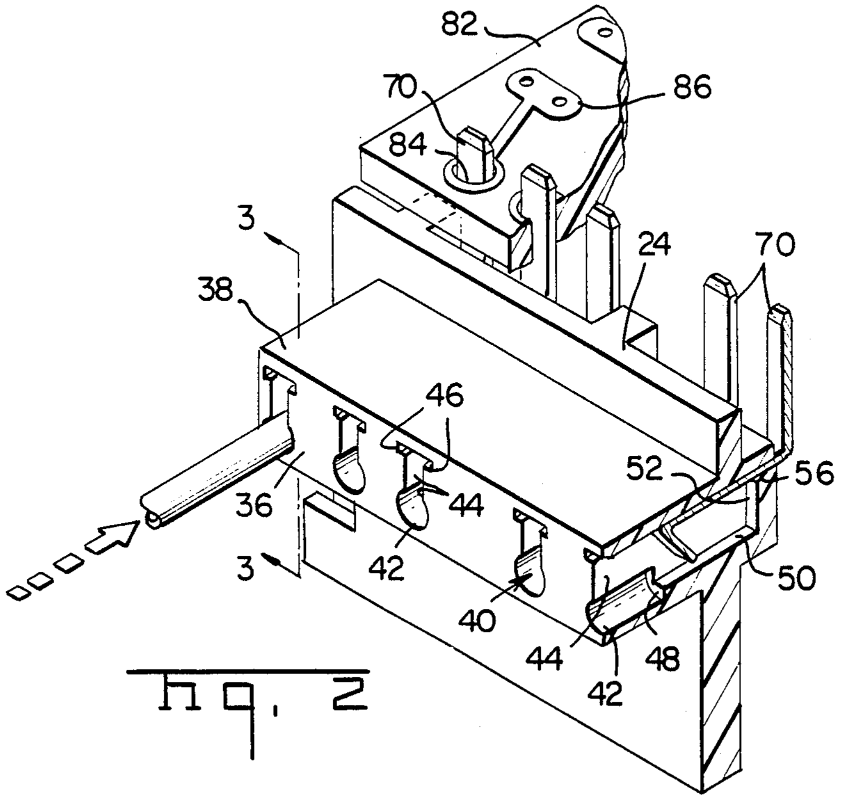
FIG. 2 is an isometric view of the electrical connector interconnected to the printed circuit board with the electrical connector partially broken away through one of the wire receiving cavities.
Figure 3:
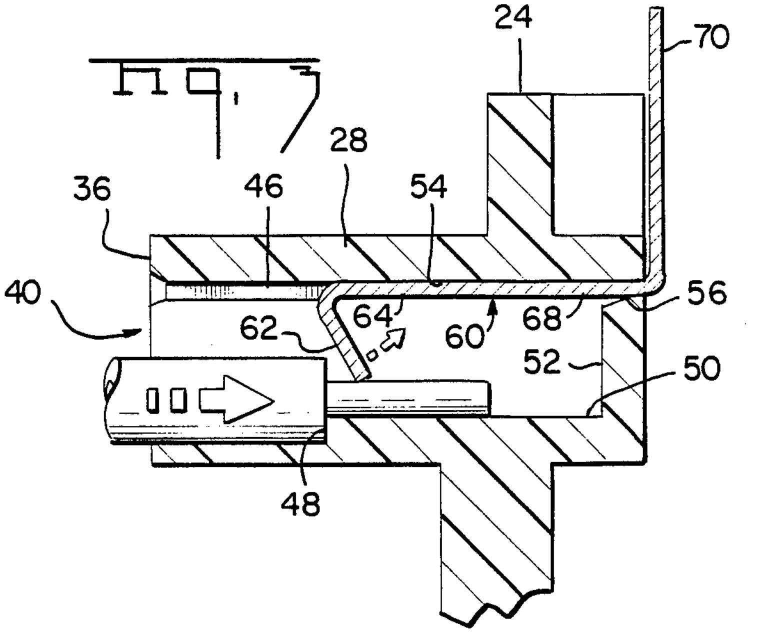
FIG. 3 is a cross-sectional view through lines 3—3 of FIG. 2.

With reference now to FIG. 2, the connector will be described in more detail. Extending into the front mating face 36 are a plurality of keyhole slots 40 including channels 46, parallel sidewalls 44 and a circular wire receiving slot 42. The channels extend only partially to the rear wall 52 to define a forwardly facing shoulder within the channel. The cutaway view in FIG. 2 through one of the keyhole slots illustrates that the circular opening 42 only extends partially into the slot 40, defining a semicircular shoulder 48. Referring now to FIG. 3, each of the slots further comprise a floor 50, a ceiling 54 and an endwall 52, the endwall having a plurality of apertures 56 extending therethrough.

Figure 4:
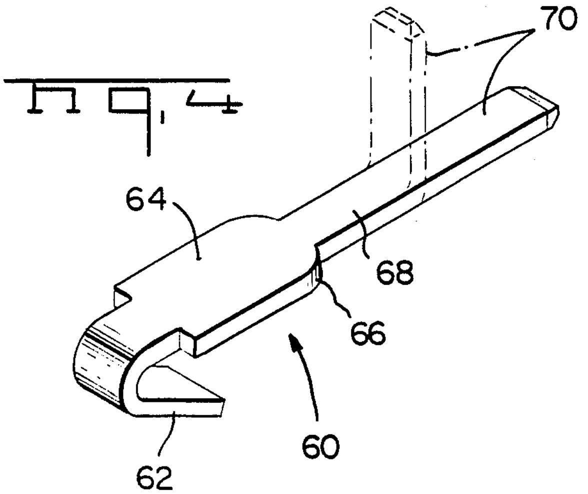
FIG. 4 is an isometric view of the terminal of the electrical connector of the instant invention.

Referring now to FIG. 4, the terminal 60 is shown as comprising a flat blade portion 64 having a resilient contact portion 62 extending from one end and a leg portion 68 extending from the other end. When intially installed, the terminal must be as shown in FIG. 4 with the leg extending in the same plane as the flat blade portion 64, however after the terminal is installed, the leg portion is formed upwardly to define a printed circuit board interconnect shown in phantom as 70. The intersection of the flat blade portion 64 and the leg portion 68 defines a shoulder 66.

Referring now to FIGS. 2 and 3, to assemble the connector, the terminal 60 is inserted through the front mating face 36 of the connector, each terminal being received in a keyhole slot 40. The channels 46 are profiled to receive the flat blade portion 64 of the terminal therein while the sidewalls 44 are profiled for receiving the width of the resilient contact portion 62, therethrough. The terminals 60 are inserted into the keyhole slots until the shoulders 66 of the terminals 60 abut the forwardly facing shoulders in the channels. As shown in FIG. 2 or 3, the leg portion 68 extends upwardly to form printed circuit board interconnection portions 70.

Referring again to FIG. 1, the connectors 20 are shown poised for receipt into the printed circuit board 82. The printed circuit boards 82 generally comprise a substrate 82 having a plurality of circuit traces 86 thereon, which are interconnected to the printed circuit board through holes 84. Each connector portion 20 has a printed circuit board interconnection portion 70 in registration with the printed circuit board through holes 84. Each of the connectors are then installed onto the printed circuit board 82 until the surface 24 of the connector housing abuts the back side of the printed circuit board 82. The circuit board interconnection portions 70 are then soldered to the through holes 84. The connectors 20 and the circuit board assembly 80 can then be inserted into the ballast housing 4 to be sealed.

Figure 1A:
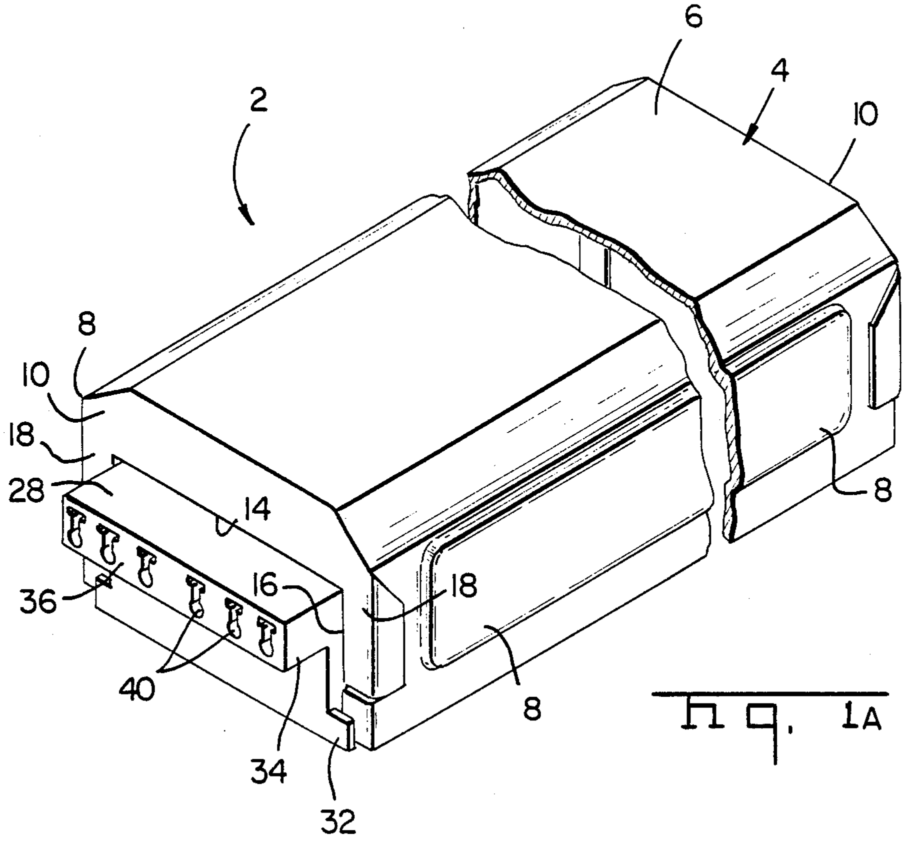
FIG. 1A is a view similar to that of FIG. 1 showing the assembled electrical ballast.

Referring now to FIG. 1A, the printed circuit board assembly 80 with the connectors 20 interconnected thereto are shown disposed within the ballast housing 4. As shown in FIG. 1A, the insulative housing portion 22 of the connector 20 is designed to closely fit within the cutout portion in the endwalls 10 of the ballast housing 4. As installed, the side edges 34 of the connector housing 22 abut the side edges 16 of the ballast sidewalls 18 and the top surface 28 of the ledge portion 38 abuts the upper edge 14 of the cutout portion within the endwall 10. To further seal the endwalls 10, surface 30 of the connector body 22 is inserted behind the sidewall 18 and the surface 26 is inserted behind the endwall 10. The tab portion 32 remains on the outside of sidewall 18, which places the sidewall 18 between the tabs 32 and between the surface 30, thereby retaining the connector 20 in place within the cutout portion. It should also be noted that the surface 28 of the ledge portion 38 abuts the upper edge 14 when the connectors 20 are fully installed. The relationship between surfaces 28 of the connector housing and surfaces 14 and 6 of the can are so dimensioned so as to prevent the printed circuit board interconnect portions 70 or the printed circuit board from "bottoming out" on the inside of the can upper wall, thereby shorting out the terminals.

With the connectors 20 so inserted within the cutout portions of the ballast housing 4, the connector 20 seals the endwalls 10 during the potting process. The printed circuit board assembly 80 includes a printed circuit board 82 having a plurality of components mounted thereon. After the printed circuit board assembly 80 and connectors 20 are inserted into the can as previously described, the can is filled with potting compound which seals the components. The potting material is relatively viscous such that the potting material will not flow through the crevices between the connector portion 20 and the cutout portion within the ballast housing 4.

To use the assembled ballast, the ballast is simply installed within the lighting fixture as in previous ballast designs. However, to interconnect the individual conductors to the ballast, the individual conductors are simply prepared by removing a portion of the insulation from the ends and inserting the prepared ends into the circular entry 42, as shown in FIG. 3. The conductor is projected into the cavity 40, which biases the resilient contact portion 62 against the conductor, and traps the conductor 92 of the insulated wire 90 against the inner floor 50 to maintain electrical connection therewith.

As the connector is electrically connected directly to the printed circuit board 80, the integral connector eliminates the requirement of having discrete wires extending from the ballast which could present a hazard to one installing the ballast. Furthermore, eliminating the discrete wires from the ballast eliminates the need for handling of the wires during the manufacturing process, which allows for robotic assembly of the ballast. The connector 20 is simply placed on the printed circuit board 80 and the printed circuit board assembly is lowered into the ballast can 4. The integral connector also eliminates an electrical interface, and the possible failure thereof.

The integral connector 20 thus eliminates the preparation of the wires which extend from the ballast, which is a labor intensive operation. Rather the only wires which need to be prepared are the wires which extend from the light fixture, and these wires are simply inserted into the connector 20, rather than having to be twisted to wire ends of a ballast and insulted by means of a plastic wire nut. However, the end user still has the capability of adding discrete wires to the connector 20 for electrically connecting to the lighting fixture. The integral connector also provides for an assembly which is easier to test at the manufacturing site and easier to install at the place of use, in that the wire ends are simply inserted into the wire receiving openings 40 until the insulation abuts the stop shoulder 48. These advantages are achieved by incorporating the connector 20 into the housing 6 of the ballast. The connector is profiled to fit within the ballast housing in such a manner as to seal the ballast housing during the addition of the potting compound.

The instant invention was disclosed by way of reference to the figures of the preferred embodiment, but should not be taken to limit the claims which follow.

What is claimed:

1. An electrical ballast for use with flourescent lights and the like, the ballast comprising:

an outer shell means having sidewalls and endwalls, a portion of said outer shell means having a connector locating area defined by a cutout area in at least one of the endwalls;

a printed circuit board having the ballast components mounted thereon and circuit board through holes located adjacent to the connector locating area, the printed circuit board being disposed in the shell means though an open face of said shell means; and an electrical connector means mounted to said printed circuit board, the electrical connector means including an insulative housing having spaced plates along side edges of the housing for receipt in the cutout area of said outer shell means, the electrical connector having contact means for interconnection to stripped insulated conductors, said contact means including terminal means extending through an aperture in said housing for connection to the circuit board through holes.

2. The ballast of claim 1 wherein the connector locating area comprises a cutout portion in at least one of said endwalls.

3. The ballast of claim 2 wherein said electrical is profiled to be slidably receivable in said cutout portion.

4. The electrical ballast of claim 1 wherein the connector means includes electrical terminal means having portions interconnectable with the printed circuit board.

5. The electrical connector of claim 4 wherein the electrical connector means includes an insulative body portion having a front mating face and a plurality of wire receiving openings therein, extending from the front mating face.

6. The electrical connector of claim 5 wherein the terminal includes a resilient contacting portion disposed adjacent to the wire receiving opening for contacting the conductor of a wire insertable through the wire reciving opening.

7. The electrical connector of claim 6 wherein the terminal comprises a flat blade portion located in a channel which extends from the front mating face to a rear face of the connector.

8. The electrical connector of claim 7 wherein the resilient contact portion comprises a finger portion contiguous with the flat blade portion and extends downwardly and orthoginally away from the front mating face.

9. An electrical connector for use with an electrical ballast which includes an outer housing having sidewalls and endwalls, with a cutout portion within at least one of the endwalls, and a printed circuit board disposed within the housing having the electrical components disposed thereon, the connector comprising:

an insulative housing for mounting within an opening in the ballast outer housing, the insulative housing including spaced plates along side edges thereof profiled for receipt in the cutout portion, the housing having terminal receiving openings therein; and a plurality of electrical terminals disposed within the terminal receiving openings, each electrical terminal having a portion interconnectable with the printed circuit board, and an end which is interconnectable with a mating conductor.

10. The electrical connector of claim 9 wherein the connector comprises means for mounting within an opening means in the housing endwall.

11. The electrical connector of claim 9 wherein the insulative housing includes a central vertical wall having a front mating face parallel to said central wall, with said terminal receiving openings extending normally into the front mating face.

12. The electrical connector of claim 9 wherein said terminal portions interconnectable to said printed circuit board are disposable within an envelope defined by said ballast housing sidewalls and endwalls, the said conductor interconnecton end is disposable outside of the envelope defined by the ballast housing sidewalls and endwalls.

13. The electrical connector of claim 11 wherein the terminal receiving opening is defined by sidewalls, a floor and a ceiling which all extend towards a rear face of said central wall.

14. The electrical connector of claim 13 wherein the sidewalls include channels therein which extend adjacent to the ceiling, and a circular opening is disposed adjacent to the floor in an intersecting relationship therewith.

15. The electrical connector of claim 14 wherein the terminal includes a leg portion extending into the terminal receiving cavity, and through an aperture in the central wall, the leg portion which projects through the central wall extending in a transverse direction from the terminal receiving cavity.

16. The electrical connector of claim 15 wherein the terminal further comprises a flat blade portion having a rearwardly facing shoulder, the flat blade portions being disposed within said channels until the shoulder of said flat blade portion abuts the shoulder within said channels.

17. The electrical connector of claim 16 wherein the terminal portion interconnectable with a matable conductor comprises a second leg portion which extends into the opening orthoginally away from the front mating face.

18. The electrical connector of claim 17 wherein the circular opening is profiled such that when an electrical wire with a portion of the conductor exposed, is inserted into the circular opening, the conductor lies adjacent to the floor of the insulative housing and the second leg is resiliently biased thereagainst.

* * * * *